United States Patent
He et al.

(10) Patent No.: US 11,993,704 B2
(45) Date of Patent: May 28, 2024

(54) INSULATING MEDIUM RUBBER FILM AND PRODUCTION METHOD THEREOF AND MULTI-LAYER PRINTED-CIRCUIT BOARD

(71) Applicant: SHENZHEN NEWFILMS NEW MATERIAL TECHNOLOGY CO., LTD, Shenzhen (CN)

(72) Inventors: Yueshan He, Shenzhen (CN); Fei Liu, Shenzhen (CN); Qiong He, Shenzhen (CN)

(73) Assignee: SHENZHEN NEWFILMS NEW MATERIAL TECHNOLOGY CO., LTD, Shenzhen (CN)

( * ) Notice: Subject to any disclaimer, the term of this patent is extended or adjusted under 35 U.S.C. 154(b) by 540 days.

(21) Appl. No.: 17/279,845

(22) PCT Filed: Sep. 19, 2019

(86) PCT No.: PCT/CN2019/106789
§ 371 (c)(1),
(2) Date: Mar. 25, 2021

(87) PCT Pub. No.: WO2021/042418
PCT Pub. Date: Mar. 11, 2021

(65) Prior Publication Data
US 2022/0033642 A1     Feb. 3, 2022

(30) Foreign Application Priority Data

Sep. 5, 2019  (CN) .......................... 201910838331.5

(51) Int. Cl.
| | |
|---|---|
| *C08L 63/00* | (2006.01) |
| *C09J 7/10* | (2018.01) |
| *C09J 163/00* | (2006.01) |
| *H05K 1/03* | (2006.01) |
| *H05K 1/02* | (2006.01) |

(52) U.S. Cl.
CPC ............... *C08L 63/00* (2013.01); *C09J 7/10* (2018.01); *C09J 163/00* (2013.01); *H05K 1/0326* (2013.01); *C08L 2203/206* (2013.01); *C08L 2205/035* (2013.01); *C09J 2467/005* (2013.01); *H05K 1/0298* (2013.01)

(58) Field of Classification Search
None
See application file for complete search history.

(56) References Cited

U.S. PATENT DOCUMENTS 5,639,514 A * 6/1997 Jones ................... C09D 163/00
118/410

FOREIGN PATENT DOCUMENTS

| CN | 105388397 A | 9/2009 |
|---|---|---|
| CN | 105838272 A | 8/2016 |
| CN | 107779154 A | 3/2018 |
| CN | 109135647 A | 1/2019 |
| WO | 2017/199764 A1 | 11/2017 |

OTHER PUBLICATIONS

International Search Report issued on Jun. 4, 2020 in corresponding International Application No. PCT/CN2019/106789; 6 pages.
First Office Action issued on May 15, 2020 in corresponding Chinese Application No. 201910838331.5; 16 pages.
Second Office Action issued on Jul. 29, 2020 in corresponding Chinese Application No. 201910838331.5; 16 pages.
Third Office Action issued on Sep. 11, 2020 in corresponding Chinese Application No. 201910838331.5; 7 pages.

* cited by examiner

*Primary Examiner* — Sheeba Ahmed
(74) *Attorney, Agent, or Firm* — Maier & Maier, PLLC

(57) ABSTRACT

An insulating medium rubber film and a production method thereof, and a multi-layer printed-circuit board. The insulating medium rubber film includes a release film and an insulating medium layer arranged on the surface of the release film, where materials of the insulating medium layer include saturated polyester resin, amino resin or blocked isocyanate, epoxy resin, a curing agent, inorganic filler and a curing accelerator. According to the insulating medium rubber film and the production method thereof and the multi-layer printed-circuit board, by introducing the saturated polyester resin component into an epoxy resin composition, the produced insulating medium rubber film has the advantages that a dielectric constant is low, a dielectric dissipation factor is low, thermal expansion is not liable to happen, and adhesion is good.

13 Claims, 1 Drawing Sheet

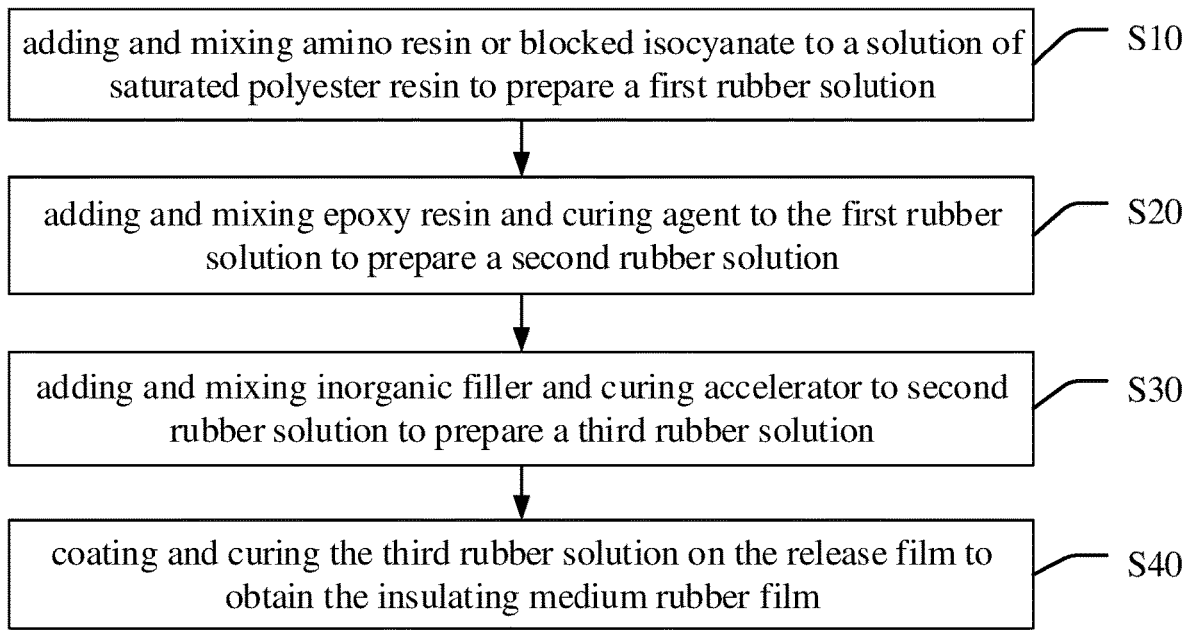

INSULATING MEDIUM RUBBER FILM AND PRODUCTION METHOD THEREOF AND MULTI-LAYER PRINTED-CIRCUIT BOARD

CROSS-REFERENCES TO RELATED APPLICATIONS

This application is a national stage application of PCT Patent Application No. PCT/CN2019/106789, filed on 19 Sep. 2019, which claims priority to Chinese Patent Application No. 201910838331.5, filed on 5 Sep. 2019, the content of all of which is incorporated herein by reference.

FIELD

The present disclosure relates to the field of a high-density multi-layer circuit board packaging material, in particular to an insulating medium rubber film and a production method thereof, and a multi-layer printed-circuit board.

BACKGROUND

With a rapid development of an artificial intelligence, an electronic product is gradually becoming thinner but denser. A high-density multi-layer circuit board is usually applied as a packaging substrate for a plurality of portable electronic products including a mobile phone, a digital camera, and a laptop computer. While a development of an IC (Integrated Circuit) packaging substrate from a core substrate to a thinner coreless substrate, has also made an improvement on a high-density multi-layer circuit board a hotspot in research.

The high-density multi-layer circuit board refers to, on an insulating substrate, a traditional double-sided board, or a multi-layer board, adopting a glass cloth reinforced insulating medium, and processed by electroless copper plating and copper electroplating, before forming a plurality of wires and a plurality of connecting holes, and after applying a plurality of superimpositions like this, a multi-layer printed-circuit board having a number of required layers will be accumulated and formed. A traditional multi-layer circuit board preparation process is obtaining a conductive pattern by selectively removing part of a copper foil on a surface of a copper-clad laminate, which has a plurality of procedures, thus it is difficult to control, and costly.

For a multi-layer circuit board, generally when a line width/line spacing is less than 40 microns, a line quality will not be guaranteed, while a semiconductor chip carrier generally has a line width/line spacing less than 15 microns. An only solution in the prior art is adopting a semi-additive process (SAP) or a modified semi-additive process (MSAP), which is also a most advanced manufacturing process for an HDI (High Density Interconnect Multi-layer Circuit Board) today. A technical key to the semi-additive process is a laminated material-insulating film material, which is an ABF/GX series product of Ajinomoto in Japan. It mainly uses epoxy and curing agent as well as thermoplastic phenoxy resin to act as a film-forming function. After coating a certain thickness of rubber on a PET carrier film with certain thickness, the solvent is dried by infrared heating or hot air, before obtaining an adhesive film. However, since a phenoxy resin is made of a chain-extension between phenol and epoxy, a large number of alcoholic hydroxyl groups thereof will seriously affect a dielectric property of the insulating medium, which limits an application thereof in a high-frequency and high-speed field.

Chinese patent ZL201810631718.9 adopts polyurethane acrylate resin and hydroxyethyl methacrylate after light curing to act as an epoxy resin film-forming component, and adopts aliphatic epoxy as a main body, adopting a solvent-free coating method to prepare an insulating medium rubber film. However, the solvent-free coating method is not suitable for a formulation design, while this technology has a poor flame retardancy and a large thermal expansion.

A plurality of characteristics of a low surface roughness, a low thermal expansion rate, a low dielectric loss and a high glass transition temperature required by an ABF (insulating medium) film material are currently not available in China. Thus, the ABF film material in China has always been dependent on imports, which has greatly increased a cost of a multi-layer circuit board, extremely detrimental to a healthy development of a circuit board industry in China.

Therefore, the current technology needs to be improved and developed.

SUMMARY

According to the above described defects, the purpose of the present disclosure is providing an insulating medium rubber film and a production method thereof, and a multi-layer printed-circuit board, in order to solve a plurality of problems in the prior art including that: an existing insulating medium film has a poor flexibility, a high dielectric constant, a high dielectric loss factor and is liable to have a thermal expansion.

A technical solution of the present disclosure to solve the technical problems is as follows:

An insulating medium rubber film, wherein comprising: a release film and an insulating medium layer arranged on a surface of the release film, a material of the insulating medium layer comprises saturated polyester resin, amino resin or blocked isocyanate, epoxy resin, curing agent, inorganic filler and curing accelerator.

The insulating medium rubber film, wherein the material of the insulating medium layer comprises, by weight, 5-30 units of saturated polyester resin, 0.5-3 units of amino resin or blocked isocyanate, 45-75 units of epoxy resin, 1-25 units of curing agent, 1-100 units of inorganic filler and 0.1-5 units of curing accelerator.

The insulating medium rubber film, wherein a chemical structural formula of the saturated polyester resin is:

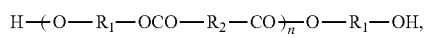

wherein n is 1-100, R1 and R2 are selected independently from a plurality of alkyl groups, phenyl groups, naphthyl groups or combination groups thereof, all the groups have less than 20 carbon atoms.

The insulating medium rubber film, wherein the amino resin is a resin formed by a condensation polymerization of melamine or benzonquanmine, with formaldehyde and organic alcohol.

The insulating medium rubber film, wherein the blocked isocyanate is at least one of phenol-blocked HDI (hexamethylenene diisocyanate), MDI (diphenyl-methane-diisocyanate), TDI (toluene diisocyanate), and PDI (phorone diisocyanate); or the blocked isocyanate is at least one of a caprolactam-blocked HDI, MDI, TDI and PDI.

The insulating medium rubber film, wherein the epoxy resin is at least one selected from a bisphenol A epoxy resin, bisphenol F epoxy resin, DCPD (dicyclopentadiene) epoxy resin, triphenol epoxy resin, biphenyl epoxy resin, naphthol epoxy resin and phosphorus-containing epoxy resin.

The insulating medium rubber film, wherein the curing agent is at least one selected from dicyandiamide, aromatic amine, phenolic compounds, active grease, and phosphorus-containing phenolic aldehyde.

The insulating medium rubber film, wherein a thickness of the release film is 10-100 μm, and a thickness of the insulating medium layer is 10-200 μm.

A production method for the insulating medium rubber film, wherein comprising steps:
  adding and mixing amino resin or blocked isocyanate to a solution of saturated polyester resin to prepare a first rubber solution;
  adding and mixing epoxy resin and curing agent to the first rubber solution to prepare a second rubber solution;
  adding and mixing inorganic filler and curing accelerator to the second rubber solution to prepare a third rubber solution;
  coating and curing the third rubber solution on a release film to obtain the insulating medium rubber film.

A multi-layer printed-circuit board, wherein comprising the insulating medium rubber film described in the present disclosure.

Benefits: The present disclosure provides an insulating medium rubber film, comprising: a release film and an insulating medium layer arranged on a surface of the release film, a material of the insulating medium layer comprises saturated polyester resin, amino resin or blocked isocyanate, epoxy resin, curing agent, inorganic filler and curing accelerator. By introducing the saturated polyester resin component into an epoxy resin composition, the present disclosure makes the insulating medium rubber film produced have a plurality of advantages including a low dielectric constant, a low dielectric dissipation factor, and a good adhesion.

BRIEF DESCRIPTION OF THE DRAWINGS

FIG. 1 illustrates a flowchart on an embodiment of the production method for the insulating medium rubber film provided by the present disclosure;

DETAILED DESCRIPTION OF THE EMBODIMENTS

The present discloser provides an insulating medium rubber film and a production method thereof, and a multi-layer printed-circuit board, in order to make the purpose, technical solution and the advantages of the present disclosure clearer and more explicit, further detailed descriptions of the present disclosure are stated here, referencing to the attached drawings and some embodiments of the present disclosure. It should be understood that the detailed embodiments of the disclosure described here are used to explain the present disclosure only, instead of limiting the present disclosure.

An embodiment of the present disclosure provides an insulating medium rubber film, wherein comprising: a release film and an insulating medium layer arranged on a surface of the release film, a material of the insulating medium layer comprises saturated polyester resin, amino resin or blocked isocyanate, epoxy resin, curing agent, inorganic filler and curing accelerator.

Specifically, in the prior art, it usually mixes a thermoplastic phenolic resin and an epoxy resin to prepare an insulating medium film. However, since the phenolic resin is made of chain-extension between phenol and epoxy, which contains a large plurality of alcoholic hydroxyl groups, while a strong polarity of the alcoholic hydroxyl groups will affect a dielectric property of the insulating medium film. In the present embodiment, a saturated polyester resin component is introduced into the epoxy resin, and the saturated polyester resin is prepared by a polymerization reaction of a polyhydric alcohol and a polybasic acid, and the saturated polyester resin only contains a plurality of hydroxyl groups at end, without any polar hydroxyl groups in the middle, thus a polarity of the saturated polyester resin is relatively weak, and an insulating medium rubber film formed by the saturated polyester resin mixed with epoxy resin has a lower dielectric constant and a lower dielectric loss factor, so as to have a better dielectric property. At a same time, the present embodiment further introduces amino resin or blocked isocyanate into the epoxy resin, since the amino resin or blocked isocyanate can undergo a cross-linking reaction with the saturated polyester resin, it is not only able to remove a plurality of hydroxyl groups at both ends of the saturated polyester resin, so as to further reduce a polarity of the saturated polyester resin and improve a dielectric property thereof, but also increase a molecular weight of the saturated polyester resin, and improve a film-forming effect.

In some implementations, based on a comprehensive consideration of a process ability, a final heat resistance, an adhesion, and the dielectric property of the insulating medium layer, the present embodiment prefers that the material of the insulating medium layer comprises, by weight, 5-30 units of saturated polyester resin, 0.5-3 units of amino resin or blocked isocyanate, 45-75 units of epoxy resin, 1-25 units of the curing agent, 1-100 units of the inorganic filler and 0.1-5 units of the curing accelerator. The insulating medium layer prepared according to a formula in the present embodiment has an excellent dielectric property.

In some implementations, a chemical structural formula of the saturated polyester resin is $H\text{-}(O\text{---}R_1\text{---}OCO\text{---}R_2\text{---}CO\text{---})_nO\text{---}R_1\text{---}OH$, wherein n is 1-100, R1 and R2 are independently selected from a plurality of alkyl groups, phenyl groups, naphthyl groups or a combination groups thereof, all the groups have less than 20 carbon atoms. The saturated polyester resin provided in the present embodiment has an excellent film-forming property, and the saturated polyester resin contains a small amount of hydroxyl groups, having a relatively weak polarity, when mixed with the epoxy resin, the amino resin or the blocked isocyanate, the curing agent, the inorganic filler and the curing accelerator, to prepare an insulating medium layer, the insulating medium layer will have a relatively low dielectric constant and a relatively low dielectric loss factor.

In a plurality of implementations, a relative molecular weight of the saturated polyester resin is 8000-30000. If the relative molecular weight of the saturated polyester resin is less than 8000, it will be not conducive for a film formation. If the relative molecular weight of the saturated polyester resin is greater than 30,000, the molecular weight will be too large and causing a solubility too low, which is not conducive to mix the saturated polyester resin with the epoxy resin to form a film.

In some implementations, the amino resin is a resin formed by a polycondensation of melamine or benzonquanmine and formaldehyde and organic alcohol. In the present embodiment, the amino resin is a polyfunctional polymer, and as a cross-linking agent, it is possible to cross-link with a plurality of saturated polyester resin containing hydroxyl groups at an end, thereby increasing a molecular weight of the saturated polyester resin and reducing a polarity of the saturated polyester resin, enhancing a dielectric property of the insulating medium layer.

In some implementations, the blocked isocyanate is selected from, but not limited to, at least one of a phenol-blocked HDI, MDI, TDI, and PDI. In the present embodiment, as a cross-linking agent, the blocked isocyanate may also have a cross-linking reaction with a plurality of saturated polyester resin containing hydroxyl groups at an end, to increase the molecular weight of the saturated polyester resin and reducing the polarity of the saturated polyester resin, enhancing the dielectric property of the insulating medium layer.

In some implementations, the blocked isocyanate is selected from, but not limited to, at least one of a caprolactam-blocked HDI, MDI, TDI and PDI.

In some implementations, the epoxy resin is selected from, but not limited to, at least one of a bisphenol A epoxy resin, bisphenol F epoxy resin, DCPD epoxy resin, triphenol epoxy resin, biphenyl epoxy resin, naphthol epoxy resin and phosphorus-containing epoxy resin. In some implementations, the epoxy resin is a phosphorus-containing epoxy resin, a phosphorus content in the phosphorus-containing epoxy resin is 2-5%, and an epoxy equivalent is 200-600 g/mol.

In some implementations, the curing agent is selected from, but not limited to, at least one of dicyandiamide, aromatic amine, phenolic compounds, active grease, and phosphorus-containing phenolic aldehyde.

In some implementations, the curing accelerator is selected from, but not limited to, at least one of 2-methylimidazole, 2-ethyl-4-methylimidazole, 2-phenylimidazole, DMP-30 (tris(dimethylaminomethyl)phenol), pyridine and p-toluenesulfonic acid.

In some implementations, the inorganic filler is selected from, but not limited to, at least one of aluminum hydroxide, magnesium hydroxide, aluminum oxide, boron nitride, aluminum nitride, silicon carbide, zeolite, wollastonite, silicon dioxide, magnesium oxide, calcium silicate, calcium carbonate, clay, talc and mica. In the present embodiment, an amount of the inorganic filler can be adjusted appropriately according to a purpose of use. In an embodiment, the material of the insulating medium layer comprises 25-100 units of the inorganic filler.

In some implementations, a thickness of the release film is 10-100 μm, and a thickness of the insulating medium layer is 10-200 μm.

In some implementations, a production method for the insulating medium rubber film is further provided, wherein shown as FIG. 1, comprising steps:

S10. adding and mixing amino resin or blocked isocyanate to a solution of saturated polyester resin to prepare a first rubber solution;

S20. adding and mixing epoxy resin and curing agent to the first rubber solution to prepare a second rubber solution;

S30. adding and mixing inorganic filler and curing accelerator to the second rubber solution to prepare a third rubber solution;

S40. coating and curing the third rubber solution on the release film to obtain the insulating medium rubber film.

In some implementations, the saturated polyester resin solution comprises an organic solvent and a saturated polyester resin dispersed in the organic solvent, and the organic solvent is selected from one or two of butanone and cyclohexanone.

In some implementations, the third rubber solution coated on the release film is cured by direct heating or hot air, making the third rubber solution form an insulating medium layer. When adopting a method of direct heating to cure the third rubber solution, a heating temperature is set according to a boiling point of a solvent in the third rubber solution, and the heating temperature is set to 80-130° C., with a heating time of 5-20 min In some implementations, a multi-layer printed-circuit board is further provided, wherein comprising the insulating medium rubber film described in the present disclosure.

In an embodiment, laminating the insulating medium rubber film and a PCB board with an inner circuit well, at 80-130° C. and a pressure condition of 0.1-1 MPa, followed by pressing in a vacuum press, at a pressing temperature of 150-200° C., and a curing time of 30-90 mins, with a pressure of 0.5-4 MPa, before the multi-layer printed-circuit board is prepared.

More detailed descriptions on the present disclosure are listed herein, by a plurality of embodiments.

Embodiment 1

Take 20 units of DYNAPOL LH826-05A (a trade name of German Degussa, a saturated polyester resin), dissolve in an isophorone solvent, and add 1 unit of HMMM (hexamethoxymethyl melamine) after being dissolved completely at a room temperature or a medium temperature condition, stir a certain period of time for standby; then add 30 units of NPEL-128 (a difunctional epoxy resin, a trade name of Nanya Plastic Industry Co., Ltd.) and 35 units of XZ92530 phosphorus-containing epoxy resin, stir evenly, and add 2.5 units of a curing agent of dicyandiamide after being dissolved in a DMF (N,N-dimethylformamide) solvent into the rubber solution described above, as well as add 50 units of silica spheres, stir and disperse thoroughly, before finally put in a certain amount of a curing accelerator 2-ethyl-4 methylimidazole and BYK450, stir evenly for standby. Take a PET (polyethylene terephthalate) release film having a smooth, clean and flat surface with a thickness of 38 μm and a size of 300*300 cm, one side of the release film is uniformly coated with the rubber solution described above, and after baking in an oven at 120° C. for 7 minutes, an adhesive sheet is obtained. Two insulating films are superimposed before placed in a vacuum hot presser at 170° C. for 60 minutes, and a substrate sample is obtained.

Embodiment 2

Take 20 units of DYNAPOL L411, dissolve in an isophorone solvent, and add 1 unit of HMMM after being dissolved completely at a room temperature or a medium temperature condition, stir a certain period of time for standby; then add 30 units of NPEL-128 difunctional epoxy and 35 units of XZ92530 phosphorus-containing epoxy, stir evenly, and add 2.5 units of a curing agent of dicyandiamide after being dissolved in a DMF solvent into a rubber solution described above, as well as add 50 units of silica spheres, stir and disperse thoroughly, before finally put in a certain amount of a curing accelerator 2-ethyl-4 methylimidazole and BYK450, stir evenly for standby. Take a PET release film having a smooth, clean and flat surface with a thickness of 38 μm and a size of 300*300 cm, one side of the release film is uniformly coated with the rubber solution described above, and after baking in an oven at 120° C. for 7 minutes, an adhesive sheet is obtained. Two insulating films are superimposed before placed in a vacuum hot presser at 170° C. for 60 minutes, and a substrate sample is obtained.

Embodiment 3

Take 20 units of DYNAPOL L411, dissolve in an isophorone solvent, and add 1 unit of Desmodur RL1265 after being dissolved completely at a room temperature or a medium temperature condition, stir a certain period of time for standby; then add 30 units of NPEL-128 difunctional epoxy and 35 units of XZ92530 phosphorus-containing epoxy, stir evenly, and add 2.5 units of a curing agent of dicyandiamide after being dissolved in a DMF solvent into a rubber solution described above, as well as add 50 units of silica spheres, stir and disperse thoroughly, before finally put in a certain amount of a curing accelerator 2-ethyl-4 methylimidazole and BYK450, stir evenly for standby. Take a PET release film, having a smooth, clean and flat surface with a thickness of 38 μm and a size of 300*300 cm, one side of the release film is uniformly coated with the rubber solution described above, and after baking in an oven at 120° C. for 7 minutes, an adhesive sheet is obtained. Two insulating films are superimposed before placed in a vacuum hot presser at 170° C. for 60 minutes, and a substrate sample is obtained.

Embodiment 4

Take 20 units of DYNAPOL L411, dissolve in an isophorone solvent, and add 1 unit of HMMM after being dissolved completely at a room temperature or a medium temperature condition, stir a certain period of time for standby; then add 30 units of NPEL-128 difunctional epoxy and 35 units of YEP250 phosphorus-containing epoxy, stir evenly, and add 1.5 units of a curing agent of dicyandiamide and 3 units of DDS after being dissolved in a DMF solvent into a rubber solution described above, as well as add 50 units of silica spheres, stir and disperse thoroughly, before finally put in a certain amount of a curing accelerator 2-ethyl-4 methylimidazole, boron trifluoride ethylamine and BYK450, stir evenly for standby. Take a PET release film, having a smooth, clean and flat surface with a thickness of 38 μm and a size of 300*300 cm, one side of the release film is uniformly coated with the rubber solution described above, and after baking in an oven at 120° C. for 7 minutes, an adhesive sheet is obtained. Two insulating films are superimposed before placed in a vacuum hot presser at 180° C. for 60 minutes, and a substrate sample is obtained.

Embodiment 5

Take 20 units of DYNAPOL L411, dissolve in an isophorone solvent, and add 1 unit of HMMM after being dissolved completely at a room temperature or a medium temperature condition, stir a certain period of time for standby; then add 30 units of NPEL-128 difunctional epoxy and 35 units of YEP250 phosphorus-containing epoxy, stir evenly, and add 25 units of a curing agent of LA-7052 and 3 units of DDS after being dissolved in a PM (polymethyl methacrylate) solvent into a rubber solution described above, as well as add 50 units of silica spheres, stir and disperse thoroughly, before finally put in a certain amount of a curing accelerator 2-ethyl-4 methylimidazole, boron trifluoride ethylamine and BYK450. Take a PET release film, having a smooth, clean and flat surface with a thickness of 38 μm and a size of 300*300 cm, one side of the release film is uniformly coated with the rubber solution described above, and after baking in an oven at 120° C. for 7 minutes, an adhesive sheet is obtained. Two insulating films are superimposed before placed in a vacuum hot presser at 180° C. for 60 minutes, and a substrate sample is obtained.

Control Embodiment

Take 20 units of YL6747H30, add 30 units of NPEL-128 difunctional epoxy, 35 units of XZ 92530 phosphorus-containing epoxy, stir evenly, add 2.5 units of a curing agent of dicyandiamide after being dissolved in a DMF solvent into a rubber solution described above, add 50 units of silica spheres to the rubber solution described above, fully stir and disperse, and finally put in a certain amount of a curing accelerator 2-ethyl-4 methylimidazole, stir evenly for use. Take a PET release film, having a smooth, clean and flat surface with a thickness of 38 μm and a size of 300*300 cm, one side of the release film is uniformly coated with the rubber solution described above, and after baking in an oven at 120° C. for 7 minutes, an adhesive sheet is obtained. Two insulating films are superimposed before placed in a vacuum hot presser at 170° C. for 60 minutes, and a substrate sample is obtained.

Performing a performance test on the substrate samples prepared in the embodiments 1 to 5 and the control embodiment, and a plurality of results obtained are as described in Table 1:

TABLE 1

| test results of the performance test of the substrate samples | | | | | | |
| --- | --- | --- | --- | --- | --- | --- |
| | Embodiment 1 | Embodiment 2 | Embodiment 3 | Embodiment 4 | Embodiment 5 | Control embodiment |
| CTE x-y (25-150° C., TMA) | 52 | 53 | 53 | 45 | 46 | 47 |
| Tg (stretch, TMA) | 148 | 147 | 147 | 157 | 155 | 153 |
| Dielectric constant (1 GHz) | 3.15 | 3.12 | 3.13 | 3.10 | 3.10 | 3.3 |
| Dielectric dissipation (1 GHz) | 0.010 | 0.008 | 0.008 | 0.007 | 0.008 | 0.012 |
| Flame retardancy | V-1 | V-1 | V-1 | V-1 | V-0 | V-1 |

It can be seen from the test results described above that the insulating medium rubber film provided by the embodiments of the present disclosure is able to reduce the dielectric constant and the dielectric loss factor under a premise of meeting a film-forming characteristic, while meeting a glass transition temperature, a coefficient of thermal expansion (CTE) not significantly degraded, and being able to reach a V-0 standard in a flame retardancy test of UL 94 as the halogen content in a required range of a JPCA halogen-free standard.

All above, the present disclosure provides an insulating medium rubber film, comprising: a release film and an insulating medium layer arranged on a surface of the release film, a material of the insulating medium layer comprises saturated polyester resin, amino resin or blocked isocyanate, epoxy resin, curing agent, inorganic filler and curing accelerator. By introducing the saturated polyester resin component into an epoxy resin composition, the present disclosure makes the insulating medium rubber film produced have an extremely good flexibility, a low dielectric constant, a low dielectric dissipation factor, not liable to generate a heat expansion, and have a good adhesion.

It should be understood that, the application of the present disclosure is not limited to the above examples listed. Ordinary technical personnel in this field can improve or change the applications according to the above descriptions, all of these improvements and transforms should belong to the scope of protection in the appended claims of the present disclosure.

What is claimed is:

1. An insulating medium rubber film, comprising:
a release film and an insulating medium layer arranged on a surface of the release film, and a material of the insulating medium layer comprises saturated polyester resin, amino resin or blocked isocyanate, epoxy resin, curing agent, inorganic filler and curing accelerator;
wherein the material of the insulating medium layer comprises, by weight, 5-30 units of saturated polyester resin, 0.5-3 units of amino resin or blocked isocyanate, 45-75 units of epoxy resin, 1-25 units of the curing agent, 1-100 units of the inorganic filler and 0.1-5 units of the curing accelerator;
wherein a relative molecular weight of the saturated polyester resin is 8000-30000, and a chemical structural formula of the saturated polyester resin is:

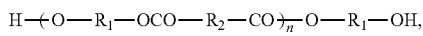

wherein n is 1-100, R1 and R2 are selected independently from the group consisting of alkyl groups, phenyl groups, naphthyl groups or combination groups thereof, all the functional groups have less than 20 carbon atoms; and
wherein the saturated polyester resin does not contain a polar hydroxyl group in the middle of the saturated polyester resin and only contains a plurality of hydroxyl groups at an end of the saturated polyester resin.

2. The insulating medium rubber film according to claim 1, wherein the amino resin is a resin formed by a condensation polymerization of melamine or benzoquanmine, with formaldehyde and organic alcohol.

3. The insulating medium rubber film according to claim 1, wherein the blocked isocyanate is selected from the group consisting of phenol-blocked hexamethylenene diisocyanate (HDI), diphenyl-methane-diisocyanate (MDI), toluene diisocyanate (TDI), and phorone diisocyanate (PDI); or, the blocked isocyanate is selected from the group consisting of a caprolactam-blocked HDI, MDI, TDI and PDI.

4. The insulating medium rubber film according to claim 1, wherein the epoxy resin is selected from the group consisting of bisphenol A epoxy resin, bisphenol F epoxy resin, dicyclopentadiene (DCPD) epoxy resin, triphenol epoxy resin, biphenyl epoxy resin, naphthol epoxy resin and phosphorus-containing epoxy resin.

5. The insulating medium rubber film according to claim 1, wherein the curing agent is selected from the group consisting of dicyandiamide, aromatic amine, phenolic compounds, active grease, and phosphorus-containing phenolic aldehyde.

6. The insulating medium rubber film according to claim 1, wherein a thickness of the release film is 10-100 μm, and a thickness of the insulating medium layer is 10-200 μm.

7. A production method for the insulating medium rubber film comprising a release film and an insulating medium layer arranged on a surface of the release film, a material of the insulating medium layer comprising saturated polyester resin, amino resin or blocked isocyanate, epoxy resin, curing agent, inorganic filler and curing accelerator, the method comprising:
adding and mixing amino resin or blocked isocyanate to a solution of saturated polyester resin to prepare a first rubber solution;
adding and mixing epoxy resin and curing agent to the first rubber solution to prepare a second rubber solution;
adding and mixing inorganic filler and curing accelerator to the second rubber solution to prepare a third rubber solution; and
coating and curing the third rubber solution on the release film to obtain the insulating medium rubber film;
wherein the material of the insulating medium layer comprises, by weight, 5-30 units of saturated polyester resin, 0.5-3 units of amino resin or blocked isocyanate, 45-75 units of epoxy resin, 1-25 units of the curing agent, 1-100 units of the inorganic filler and 0.1-5 units of the curing accelerator;
wherein a relative molecular weight of the saturated polyester resin is 8000-30000, and a chemical structural formula of the saturated polyester resin is:

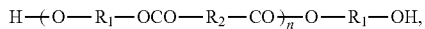

wherein n is 1-100, R1 and R2 are selected independently from the group consisting of alkyl groups, phenyl groups, naphthyl groups or combination groups thereof, all the functional groups have less than 20 carbon atoms; and
wherein the saturated polyester resin does not contain a polar hydroxyl group in the middle of the saturated polyester resin and only contains a plurality of hydroxyl groups at an end of the saturated polyester resin.

8. A multi-layer printed-circuit board, the multi-layer printed-circuit board comprising an insulating medium rubber film that comprises:
a release film and an insulating medium layer arranged on a surface of the release film, a material of the insulating medium layer comprises saturated polyester resin, amino resin or blocked isocyanate, epoxy resin, curing agent, inorganic filler and curing accelerator;

wherein the material of the insulating medium layer comprises, by weight, 5-30 units of saturated polyester resin, 0.5-3 units of amino resin or blocked isocyanate, 45-75 units of epoxy resin, 1-25 units of the curing agent, 1-100 units of the inorganic filler and 0.1-5 units of the curing accelerator;

wherein a relative molecular weight of the saturated polyester resin is 8000-30000, and a chemical structural formula of the saturated polyester resin is:

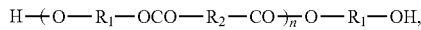

wherein n is 1-100, R1 and R2 are selected independently from the group consisting of alkyl groups, phenyl groups, naphthyl groups or combination groups thereof, all the functional groups have less than 20 carbon atoms; and wherein the saturated polyester resin does not contain a polar hydroxyl group in the middle of the saturated polyester resin and only contains a plurality of hydroxyl groups at an end of the saturated polyester resin.

9. The multi-layer printed-circuit board according to claim 8, wherein the amino resin is a resin formed by a condensation polymerization of melamine or benzoquanmine, with formaldehyde and organic alcohol.

10. The multi-layer printed-circuit board according to claim 8, wherein the blocked isocyanate is selected from the group consisting of phenol-blocked hexamethylenene diisocyanate (HDI), diphenyl-methane-diisocyanate (MDI), toluene diisocyanate (TDI), and phorone diisocyanate (PDI); or, the blocked isocyanate is selected from the group consisting of a caprolactam-blocked HDI, MDI, TDI and PDI.

11. The multi-layer printed-circuit board according to claim 8, wherein the epoxy resin is selected from the group consisting of bisphenol A epoxy resin, bisphenol F epoxy resin, dicyclopentadiene (DCPD) epoxy resin, triphenol epoxy resin, biphenyl epoxy resin, naphthol epoxy resin and phosphorus-containing epoxy resin.

12. The multi-layer printed-circuit board according to claim 8, wherein the curing agent is selected from the group consisting of dicyandiamide, aromatic amine, phenolic compounds, active grease, and phosphorus-containing phenolic aldehyde.

13. The multi-layer printed-circuit board according to claim 8, wherein a thickness of the release film is 10-100 μm, and a thickness of the insulating medium layer is 10-200 μm.

* * * * *